United States Patent
Brown et al.

(10) Patent No.: US 9,362,609 B2
(45) Date of Patent: Jun. 7, 2016

(54) MODULAR SPATIALLY COMBINED EHF POWER AMPLIFIER

(71) Applicant: Raytheon Company, Waltham, MA (US)

(72) Inventors: Kenneth W. Brown, Yucaipa, CA (US); Darin M. Gritters, Yucaipa, CA (US); Michael J. Sotelo, Chino, CA (US); Andrew K. Brown, Alta Loma, CA (US); Travis B. Feenstra, Calimesa, CA (US)

(73) Assignee: Raytheon Company, Waltham, MA (US)

( * ) Notice: Subject to any disclaimer, the term of this patent is extended or adjusted under 35 U.S.C. 154(b) by 157 days.

(21) Appl. No.: 14/230,807

(22) Filed: Mar. 31, 2014

(65) Prior Publication Data

US 2015/0280650 A1    Oct. 1, 2015

(51) Int. Cl.
| H01P 5/20 | (2006.01) |
| H03F 3/19 | (2006.01) |
| H01Q 21/00 | (2006.01) |
| H03F 1/02 | (2006.01) |
| H03F 3/21 | (2006.01) |
| H03F 1/30 | (2006.01) |
| H01P 5/02 | (2006.01) |
| H01P 5/18 | (2006.01) |
| H01P 5/107 | (2006.01) |
| H01P 5/19 | (2006.01) |
| H04B 1/036 | (2006.01) |

(52) U.S. Cl.
CPC .......... *H01P 5/20* (2013.01); *H01P 5/024* (2013.01); *H01P 5/107* (2013.01); *H01P 5/182* (2013.01); *H01P 5/19* (2013.01); *H01Q 21/0025* (2013.01); *H03F 1/0205* (2013.01); *H03F 1/30* (2013.01); *H03F 3/19* (2013.01); *H03F 3/21* (2013.01); *H03F 2200/447* (2013.01); *H03F 2200/451* (2013.01); *H04B 1/036* (2013.01)

(58) Field of Classification Search
CPC ......... H03F 3/19; H03F 1/10205; H03F 1/30; H03F 3/21; H01P 5/107; H01P 5/19; H01P 5/024; H01P 5/082; H01P 3/00; H01P 5/182; H01P 5/20; H01Q 21/0025
USPC .................. 333/125, 239, 248, 137; 343/771; 330/310

See application file for complete search history.

(56) References Cited

U.S. PATENT DOCUMENTS

| 8,107,894 B2 | 1/2012 | Lowell et al. | |
| 2014/0232483 A1* | 8/2014 | Correa | H01P 5/12 333/136 |
| 2014/0312988 A1* | 10/2014 | Lee | H03F 3/602 333/137 |

* cited by examiner

*Primary Examiner* — Benny Lee
*Assistant Examiner* — Rakesh Patel
(74) *Attorney, Agent, or Firm* — Eric A. Gifford

(57) ABSTRACT

A power amplifier uses a modular architecture in which each of the one or more modules spatially combines the power from multiple amplified channels. The individual modules are configured to operate in the EHF band and above at low loss. This entails reconfiguring the input and output splitters, the end-launched transitions between the amplifier chips and the input and output splitters and the packaging of the DC power and control board. The input splitter uses a split-block technology. The output splitter maps each amplified channel into a two-dimensional aperture.

18 Claims, 12 Drawing Sheets

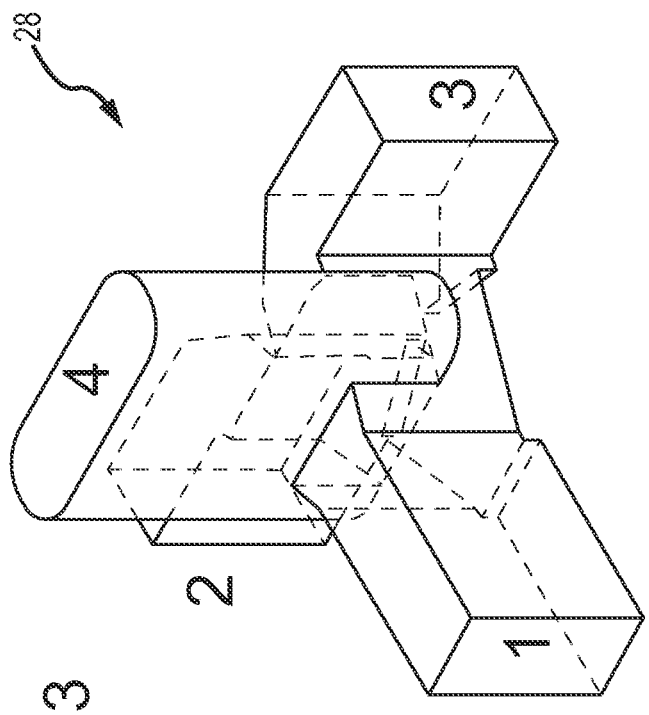
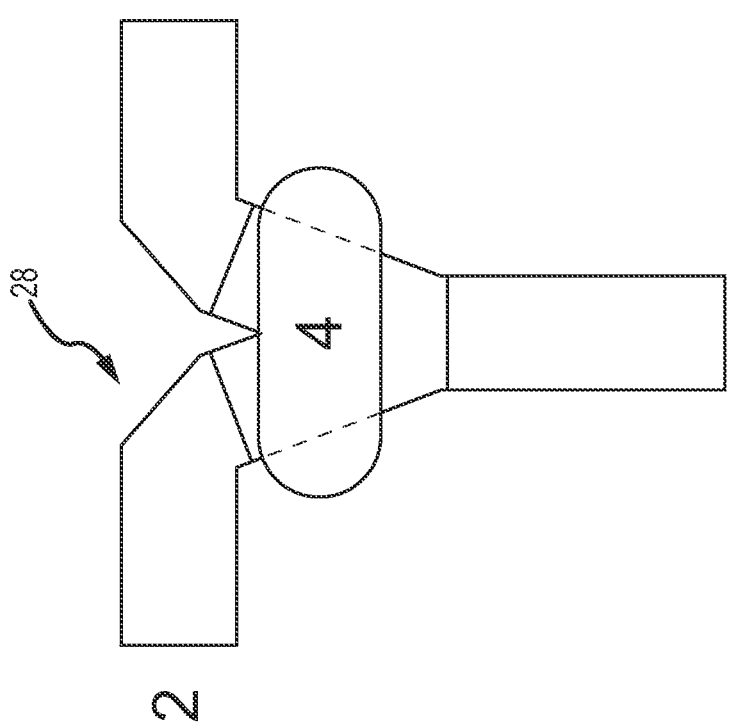

MODULAR SPATIALLY COMBINED EHF POWER AMPLIFIER

BACKGROUND OF THE INVENTION

1. Field of the Invention

This invention relates to RF power amplifiers, and particularly to spatially combined power amplifiers for high frequency applications in the EHF-band and above.

2. Description of the Related Art

Obtaining high power (>1 W) using solid-state amplifier chip technology at Extremely High Frequencies (EHF) (110-300 GHz) and particularly >200 GHz is widely viewed as improbable or impossible using today's technology. With today's technology each amplifier chip can output tens of mW of power in the EHF band. Therefore, one must combine the output power from several amplifier chips to provide >1 W of output power.

Ideally, the output powers of the amplifier chips would combine linearly. This assumes no combining loss (no conductor losses or phase/amplitude errors that effect constructive/destructive adding of power). This is obviously not practically achievable. Achieving high output power is not as simple as adding more amplifier chips to obtain the desired power level.

The typical combining approaches used across the industry include corporate or radial combining networks. The main limitation is that as more and more amplifier chips are added to the system to combine power, there is a point of diminishing returns where as more chips are added, the power will stop increasing, and will actually begin to decrease. This is mostly due to added conductor losses associated with increased distances in the network (more elements means more physical splits and greater length in the lines between each split). This problem is exacerbated at the higher frequencies in the EHF band. It is not realistically possible nor practically feasible to obtain >1 W of output power using today's amplifier chip technology in the EHF band.

Spatial combining is as close to ideal as you can get because there is no physical structure (corporate or radial) combining the power of all the elements. The power is combined in free space, so there are minimal conductor losses to deal with, and small phase and amplitude errors have less effect on the total array combining efficiency. Spatial combining has been successfully employed at lower frequencies in the W-band (75-110 GHz) to provide combined output powers >1 W. See U.S. Pat. No. 8,107,894 entitled "Modular Solid-State Millimeter Wave (MMW) RF Power Source" issued Jan. 31, 2012 and assigned to Raytheon Company, which is hereby incorporated by reference. However, the same design is inadequate at frequencies in the EHF band due to increased losses; the design simply does not scale to the higher frequency band.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a power amplifier capable of high output power at high RF frequencies, particularly frequencies in the EHF band and greater than 200 GHz using solid-state amplifier chip technology.

This is accomplished using a modular spatially combined architecture in which in each module the power from multiple amplified channels is spatially combined in free-space in the EHF band. The overall modular architecture of the power amplifier is similar to that of the W-band power amplifier including an RF splitter, a backplane and multiple modules. Each module splits the input RF signal to feed multiple solid-state amplifier chips to amplify the RF signal and radiate the amplified power into a two-dimensional aperture in free space where the power is spatially combined. In accordance with the invention, the modules are reconfigured to operate in the EHF band and above, at low loss levels, so that the spatially combined output power approximates the ideal.

In an embodiment, a module comprises a heat sink having a surface oriented in an X-Y plane. A 1:L port split-block waveguide splitter comprises an input waveguide coupled to an RF input and L output waveguides in the X-Y plane. The splitter has a bottom portion formed in the surface of the heat sink and a top portion on the surface of the heat sink. L solid-state amplifier chips having an operating wavelength $\lambda$ are mounted on the surface of the heat sink. L chip-to-waveguide end-launched transitions are configured to overhang into the L output waveguides, respectively, for an end launch coupling of the output waveguide to the chip input parallel to the chip in the X-Y plane. An output radiator waveguide array having L input waveguides is coupled to another L chip-to-waveguide end-launched transitions in the X-Y plane configured to overhang into the L input waveguide, respectively, for an end launch coupling of the chip output into the input waveguide parallel to the chip. Each of the input waveguides is coupled to M×N free-space radiating elements in a two-dimensional aperture in the X-Z plane.

In an embodiment, because the physical size of the amplifier chips does not scale with operating wavelength, the chip-to-chip spacing is greater than $\lambda$. The output radiator waveguide array is configured so that the element-to-element spacing is less than $\lambda$.

In an embodiment, the split-block waveguide splitter comprises multiple magic "T" 1:2 splitters that are cascaded to provide the 1:L split in the X-Y plane. Each magic-T splitter includes a waste port for reflections from its output ports.

In an embodiment, the end-launched transitions are formed on substrates that overhang into the waveguides. At higher frequencies these substrates are not self-supporting. In this case, each substrate extends laterally to either side of the transition. The output waveguides of the waveguide splitter and the input waveguides of the output radiator waveguide array are formed with slots at the half-height point of the output waveguide array to receive the lateral extensions and support the overhang of the substrate into the waveguides.

In an embodiment, the output radiator array comprises a three-stage cascaded splitter. A first waveguide splitter in the X-Z plane splits each of the L inputs into a first plurality of waveguides along the Z-axis, a second waveguide splitter in the X-Z plane splits each of those waveguides into a second plurality of waveguides along the X axis, and a third waveguide splitter splits each of those waveguides into a third plurality of waveguides along the Z-axis to form the M×N free-space radiating elements where M and N are integers greater than one in the two-dimensional aperture for each of the L inputs. In an embodiment, the splits are 1:2, 1:4 and 1:2 for a 4×4 split per input. In an embodiment, the first and second waveguide splitters are machined waveguides and the third waveguide splitter is formed by pressing a metal wire into the output ports of second waveguide splitter.

In an embodiment, the module further comprises L interposer circuit boards used to connect a DC power and control board to each of the amplifier chips. Each circuit board includes a first set of bond pads for connection to the amplifier chip and a second set of bond pads electrically connected to the first set of bond pads. The DC power and control board is positioned above the top portion of the split-block waveguide splitter. The board including L sets of pins, each set of pins configured to physically contact the second set of bond pads on a different one of the L interposer circuit boards.

In an embodiment, the spacing of the M×N free-space radiating elements for each of the L amplifier chips defines a two-dimensional aperture of the module. The thickness of the heat sink is approximately one-half the height of the two-dimensional aperture. The top portion of the waveguide splitter and the DC power and control board occupy the other half of the two-dimensional aperture.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 3a and 3b are top and perspective views of a Magic "T" embodiment of a split-block waveguide splitter;

DETAILED DESCRIPTION OF THE INVENTION

The present invention provides a power amplifier capable of high output power at high RF frequencies, particularly frequencies in the EHF band and greater than 200 GHz using solid-state amplifier chip technology. The power amplifier uses a modular architecture in which each of the one or more modules spatially combines the power from multiple amplified channels. The overall modular architecture of the power amplifier is similar to that of the W-band power amplifier. In accordance with the invention, the individual modules are reconfigured to operate in the EHF band and above at low loss. This entails inventive reconfiguring of the input and output splitters, the end-launched transitions between the amplifier chips and the input and output splitters and the packaging of the DC power and control board.

Figure 1A:
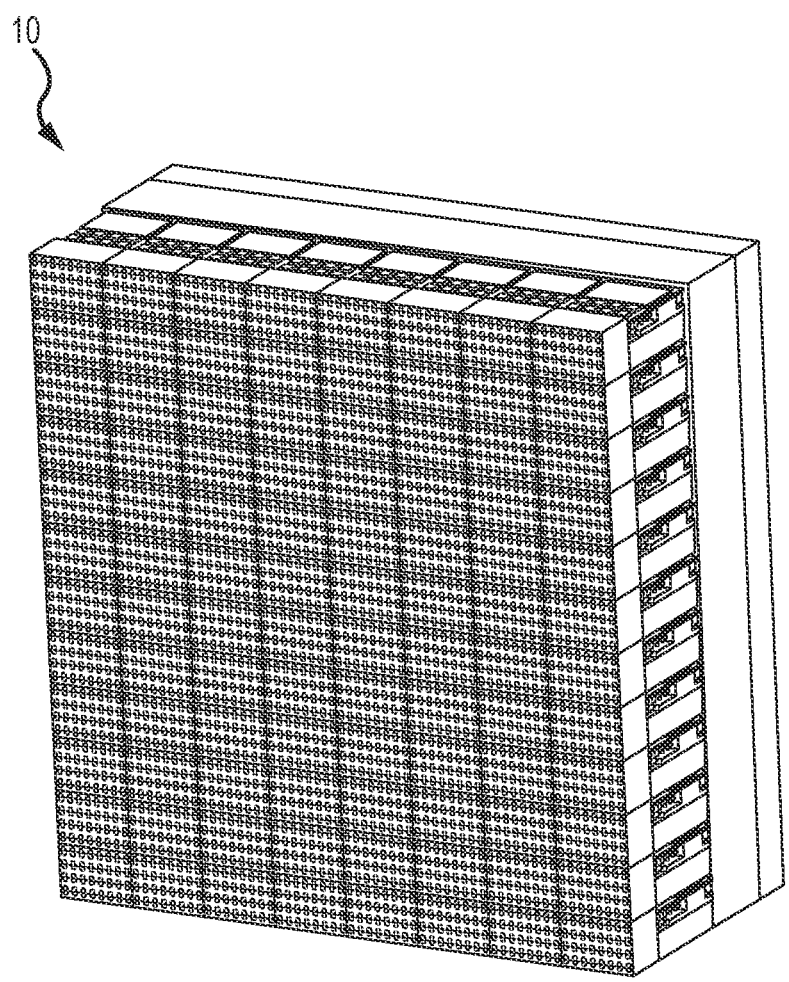
FIGS. 1a and 1b are a perspective and exploded view of an embodiment of a modular spatially combined EHF power amplifier.
Figure 1B:
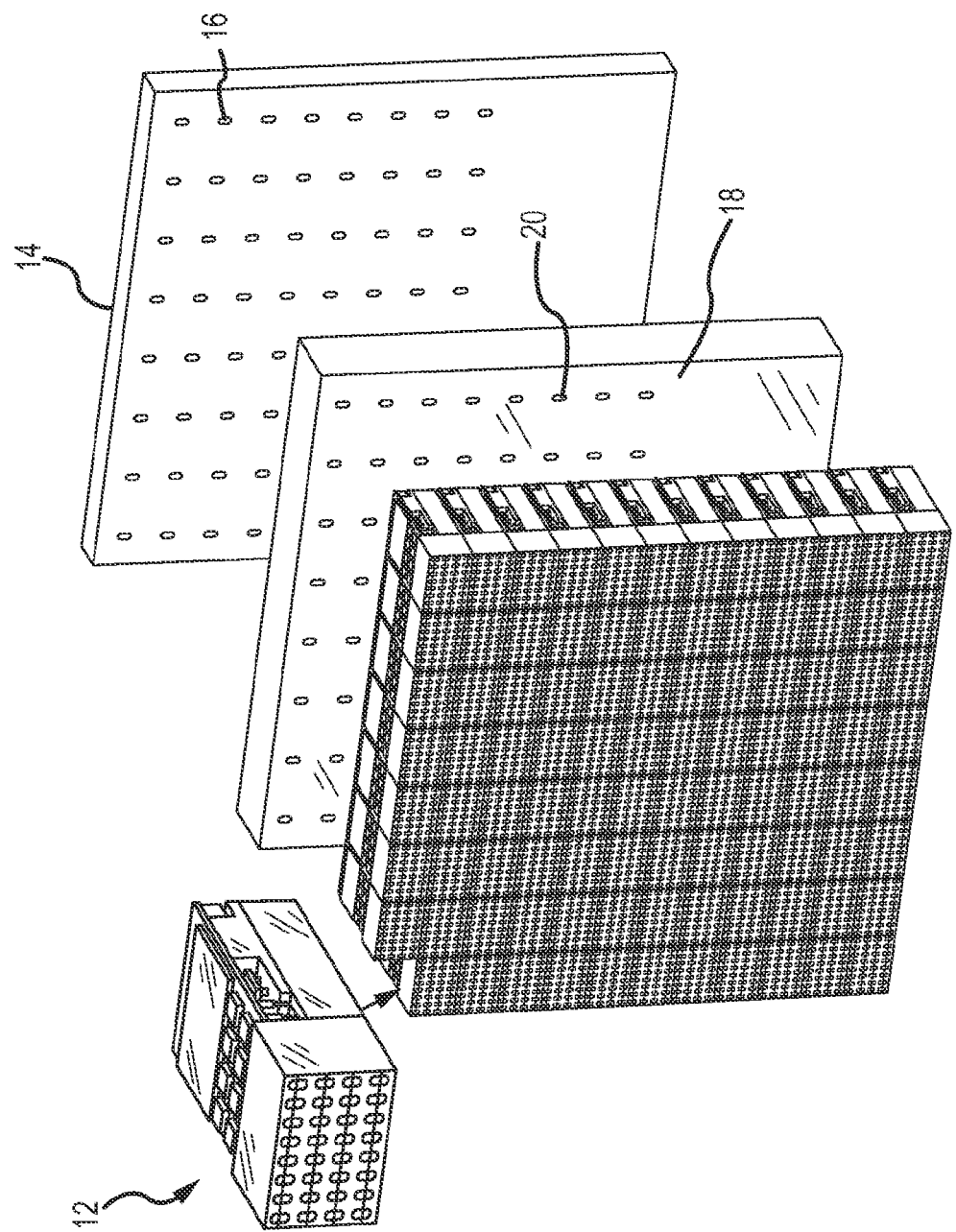

As shown in FIGS. 1a and 1b, an embodiment of a power amplifier 10 is configured as a spatially combined array of amplifier modules 12. An RF splitter 14 splits RF energy from a single input port (not shown) into an array of ports 16, one for each amplifier module 12. A backplane 18 positions the individual amplifier modules 12 to form the array. Backplane 18 is also configured with RF pass through ports 20 to couple each port 16 to an amplifier module, bias pin ports (not shown) to bring DC bias signals to each module and cooling ports (not shown) to bring liquid cooling to each module. Each amplifier module 12 splits the RF into multiple channels. A solid-state amplifier chip amplifies each channel. Each amplified channel is split to spread the amplified RF energy over a desired radiated two-dimensional aperture to meet system power density requirements. For example, if each module produces >1 W of power, a 64×64 array can produce greater than 4 KW of power.

Figure 2A:
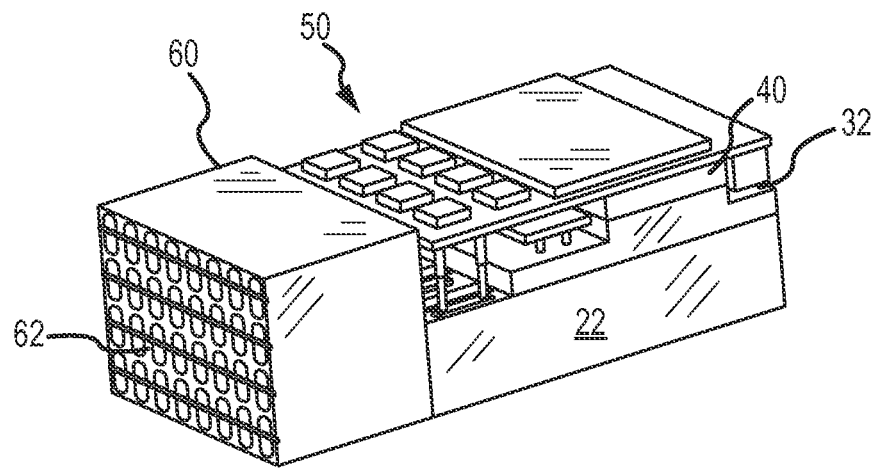
FIGS. 2a through 2c are side, back and exploded views of an EHF power amplifier sub-module.
Figure 2B:
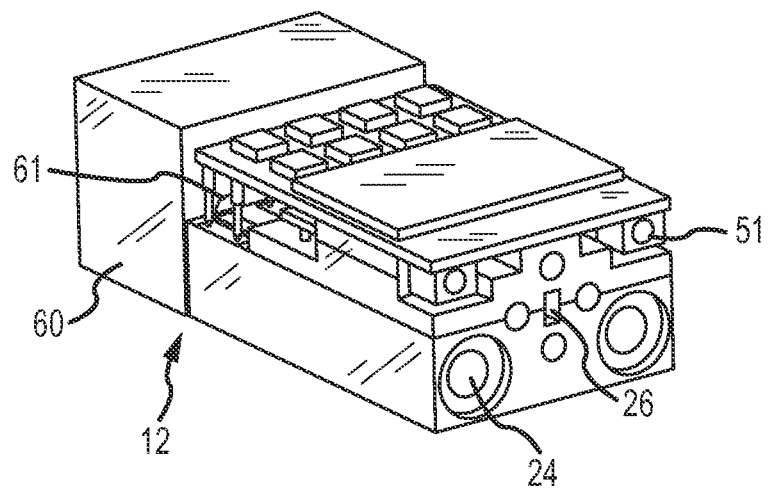
Figure 2C:
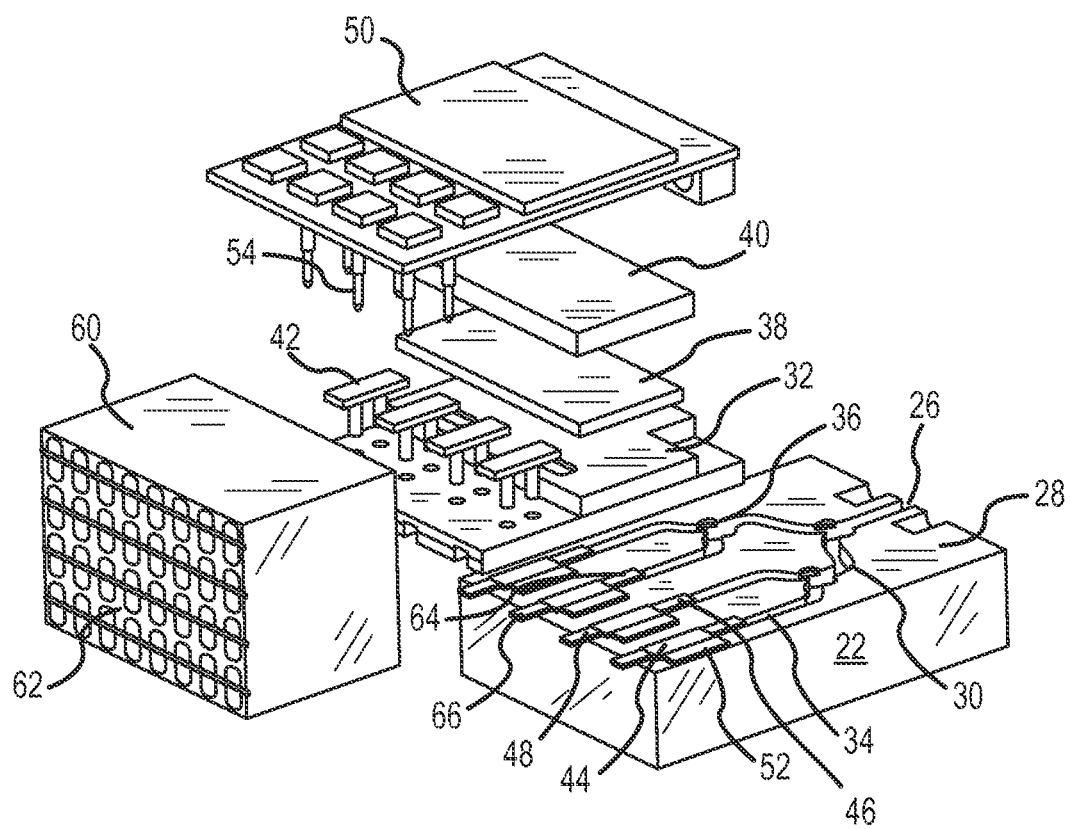
Figure 4A:
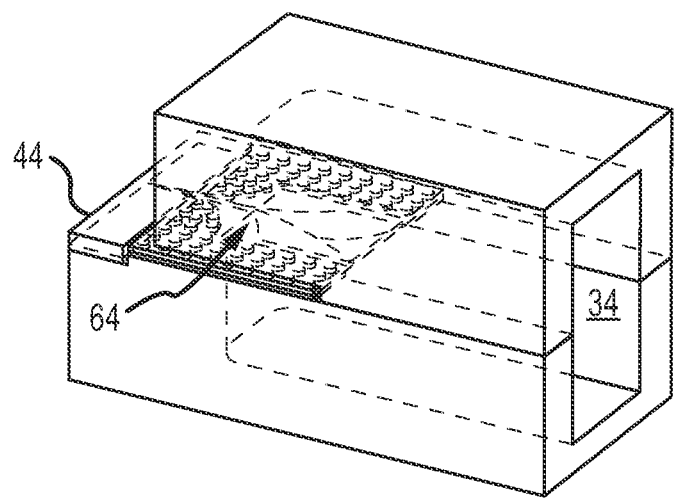
FIGS. 4a through 4d are different views of an embodiment of an end-launched transition between a waveguide of the Magic "T" splitter and the solid-state amplifier chip.
Figure 4B:
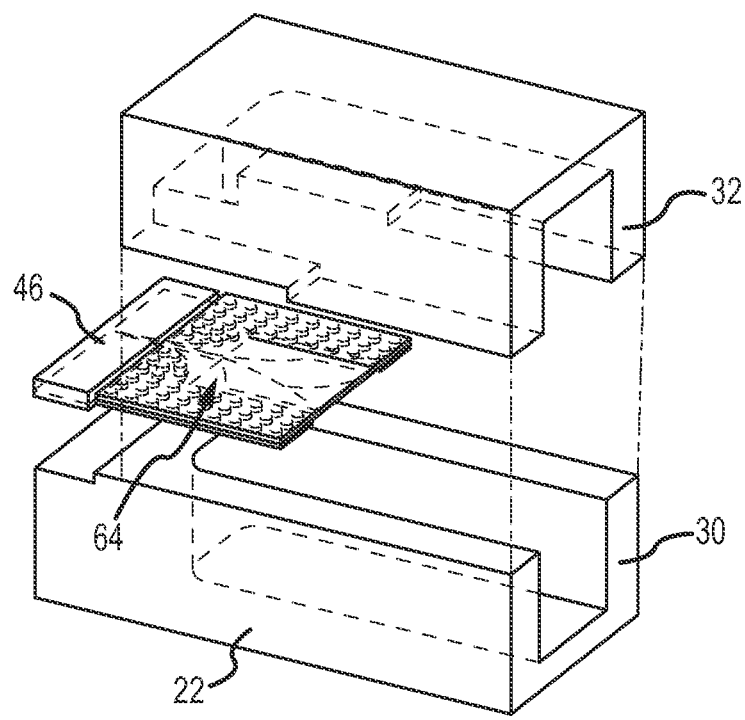
Figure 4C:
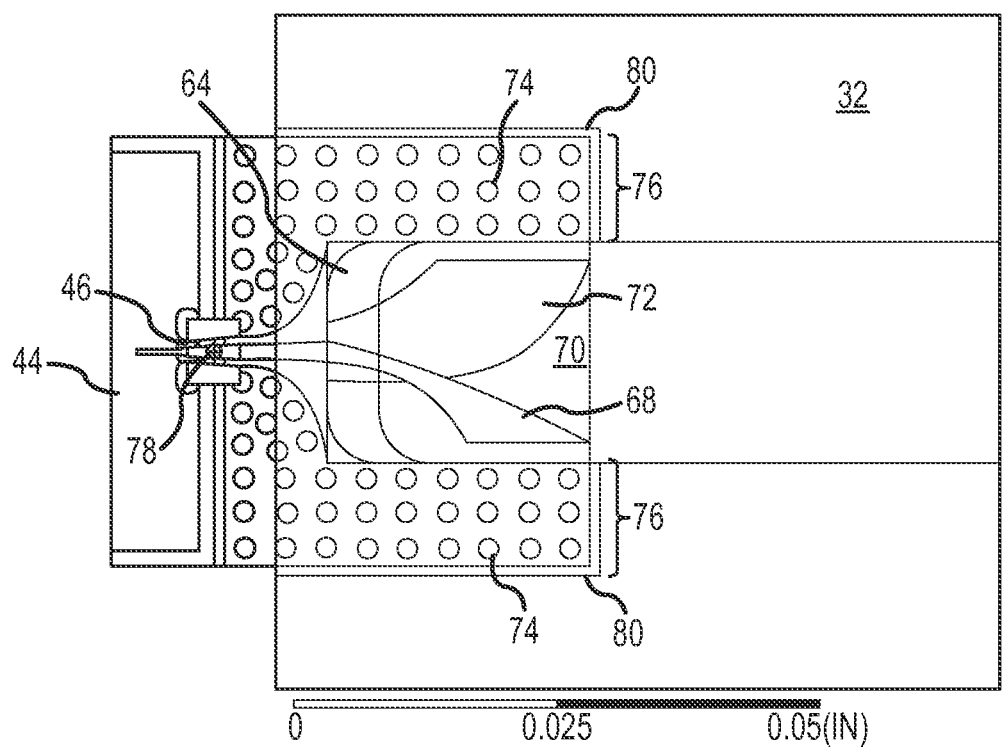
Figure 4D:
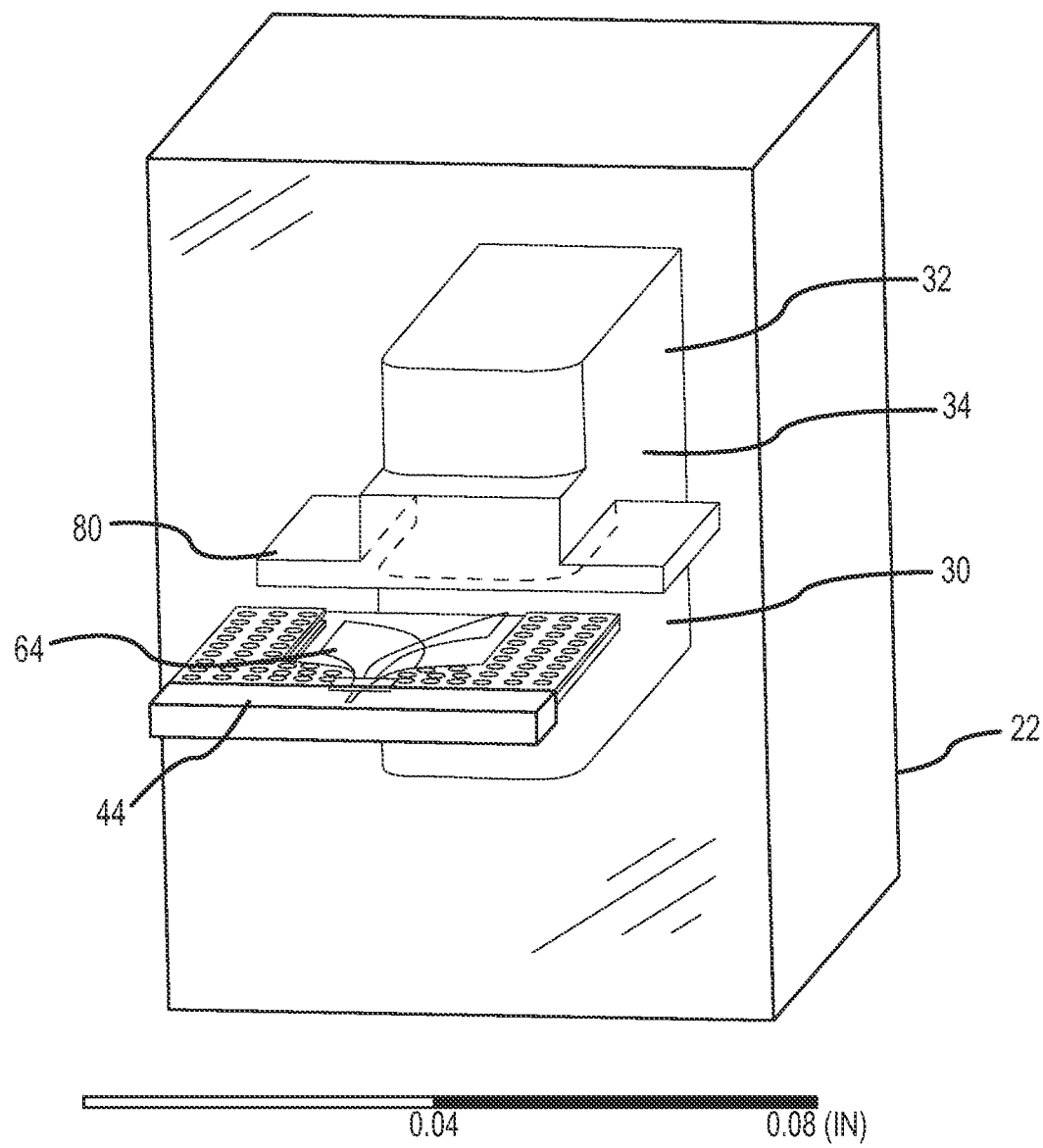

As shown in FIGS. 2a, 2b and 2c, an embodiment of amplifier module 12 comprises a heat sink 22 having a surface oriented in an X-Y plane. A number (e.g. 2) of coolant ports 24 are suitably formed on the backside of heat sink 22 to receive and return coolant.

Routing of RF from an RF input 26 to each of L (L=4 in this depiction) solid-state amplifier chips is accomplished using a split-block waveguide splitter 28 in which the waveguide is divided in half at the half-height point in the long wall of the waveguide. A bottom portion 30 of waveguide splitter 28 is formed in the heat sink 22. A top layer defines a top portion 32 that is positioned on the surface of heat sink 22 such that the top and bottom portions together form the waveguide splitter 28 that splits the RF into L waveguides 34.

In this particular embodiment, the splitter is configured as a cascade of 1:2 magic-T splitters. Each magic-T splitter includes a waste port 36 that directs reflected energy to an absorber 38 held in place and sealed by an absorber lid 40 that prevents waste radiation that is not fully absorbed from escaping from amplifier module 12. The split-block technology and magic-T configuration provides isolation between waveguide channels to reduce load pulling effects and to provide graceful degradation in the event of an amplifier chip failure.

Phase adjusters 42 are suitably coupled to each of the waveguides 34 in order to control the insertion phase and phase match the channels. An embodiment of a phase adjuster for an RF waveguide is described in co-pending U.S. patent application Ser. No. 14/201,410 entitled "Waveguide Mechanical Phase Adjuster", which is hereby incorporated by reference.

L solid-state amplifier chips 44 are suitably mounted on the heat sink 22. Each chip has an input for receiving RF and an output for outputting amplified RF. The amplifier chip amplifies RF in a spectral band associated with an operating wavelength $\lambda$. The spectral band suitably lies above 75 GHz. The band may occupy a portion of the EHF band from 110 GHz to 300 GHz or above. At these high frequencies, the chip-to-chip spacing, which is constrained by the physical size of the chips, is greater than operating wavelength $\lambda$. Placement of the amplifier chips on the module decouples the number of chips, hence output power, from the number of radiating elements Amplifier chips in the EHF band currently use Indium Phosphide Heterojunction bipolar transistors (InP HBT). Amplifier chips based on other technologies including technologies under development such as Gallium Nitride (GaN) may be used.

A DC power and control board 50 is used to condition and regulate power down to separate bias voltages for each amplifier chip. A number of bias ports 51 are suitably attached to control board 50 to receive external bias signals from the backplane. This board can dynamically adjust the bias conditions of each chip to provide varying gain, make small phase adjustments, and monitor the health of each chip. The separate board is positioned in the open volume in the module behind the aperture and above the heat sink. Electrical signals are communicated between DC power and control board 50 and the amplifier chips 44 using interposer circuit boards 52 mounted adjacent each chip. Each circuit board includes a first set of bond pads for connection to the amplifier chip and a second set of bond pads electrically connected to the first set of bond pads. The DC power and control board 50 includes L sets of pins 54 with each set of pins configured to physically contact the second set of bond pads on a different one of the interposer circuit boards 52.

An output radiator waveguide array 60 includes L input waveguides 61, one for each amplified channel. These L input waveguides along the X-axis at the half-height point of the aperture are coincident with the surface of the heat sink. Each input waveguide is split and coupled to M×N free-space radiating elements 62 (where M=N=4 in this depiction) in the two-dimensional aperture in the X-Z plane. It is important that the transmission paths in the waveguide array after the amplifier chips are low loss to maintain the overall efficiency of the power source.

The element-to-element spacing in the two-dimensional aperture is less than operating wavelength $\lambda$, and is suitably configured to meet the $½ \lambda$ spacing requirement for spatial combining. To achieve the required spacing each amplified channel must be mapped to a two-dimensional aperture i.e., M and N are both integers of two or greater. Each amplified channel cannot be mapped to a linear aperture and satisfy the spacing requirement at these frequencies.

In an embodiment, the array of free-space radiating elements 62 lies in a common Y-Z plane. The center-to-center spacing between the columns of radiating elements may be $\lambda y$, where $\lambda$ is the frequency of operation of the power source module and y is a constant typically between 0.5 and 1.0. The spacing between adjacent columns of elements may be exactly equal to the nominal spacing of $\lambda y$ or may deviate from the nominal spacing by a tolerance. The tolerance may be $\pm \lambda/10$ or some other tolerance. The constant y may be chosen such that the spacing between adjacent columns of radiating elements is from $0.5\lambda$ to $1.0\lambda$. The center-to-center spacing between the rows of radiating elements may be $\lambda z$, where $\lambda$ is the frequency of operation of the power source module and z is a constant typically between 0.5 and 1.0. The spacing between adjacent rows of elements may be exactly equal to the nominal spacing of $\lambda z$ or may deviate from the nominal spacing by a tolerance. The tolerance may be $\pm \lambda/10$ or some other tolerance. The constant z may be chosen such that the spacing between adjacent rows of radiating elements is from $0.5\lambda$ to $1.0\lambda$. The constants x and y may be equal or unequal.

The amplifier chips 44 must be coupled into the waveguides. As shown in FIG. 2c, this is accomplished using end-launched transitions 64 that couple the split-block waveguide to the chip input 46 and end-launched transitions 66 that couple the chip output 48 to the output radiator array 60. The end-launch transitions couple the chip to the waveguide parallel to the chip in the X-Y plane. An end-launch transition is a patterned strip line that may be formed by printing a conductive trace on the surface of a substrate above a conductive ground plane. One such transition is a Vivaldi transition. Other suitable end-launched transitions include a modified Vivaldi transition referred to as a "shark-fin" transition or a Yagi-Uda transition.

The end-launched transitions overhang into to the open ends of the waveguides. At higher frequencies the transition substrates may not be self-supporting. The substrates may be too thin or formed of a material such as a liquid crystal polymer lacking sufficient stiffness to rigidly support its own weight. In these cases, the ends of the waveguides may be formed with slots at the half height point and the substrates extended laterally into the slots to support the transitions.

Placement of the amplifier chips 44 away from the radiating elements 62 provides a short path with large thermal cross-section through the heat sink 22 to the backplane to remove heat. Amplifier chips may be mounted on the surface of the substrate or directly on the surface of the heat sink through holes in the substrate. The short thermal path is a result of spacing the amplifier chips away from the face of the radiating elements. The large cross-section is a result of having a single module. Rather than packing the amplifier chips in a dense array, the chips are mounted on a planar surface on the heat sink. The heat sink 22 can have a thickness of approximately one-half the thickness of the output radiator waveguide array 60 (or the module's 2D aperture) in the Z-dimension. The increased thickness and mass provide a much larger cross section to remove heat. The heat sink may be a large conductive block such as formed from, for example, solid metal or thermal pyrolytic graphite (TPG). Alternately, the thickness of the heat sink allows for passages adapted to circulate a fluid coolant.

Thermal management is enhanced by coupling the heat sink to a "cold" backplane. The module could be configured without the backplane and simply radiate heat from the heat sink. However, the cold backplane draws heat from the heat sink thereby enhancing overall heat transfer. The backplane may be made "cold" in different ways. Heat may be passively or actively removed from the backplane to reduce its temperature. Alternately, a system for circulating fluid coolant through passages in the heat sink may be provided. The backplane may also provide means to couple the RF input signal to the module's RF input and means to route DC power to the module.

A detailed view of an embodiment of the magic-T splitter 28 is shown in FIGS. 3a and 3b. RF energy is fed into port 1. This energy is split equally in magnitude and phase to ports 2 and 3. If there is a reflection from either port 2 or 3, the reflected energy is directed into port 4. This is the waste port. This port typically has a load in it to absorb this energy, but a load is not required.

The main reason to use this magic-T splitter is the port-to-port chip-to-chip isolation it provides. If one chip fails, it typically presents a short or bad reflection to the RF energy it is being fed. When this energy reflects back, it can cause issues with the power going to the adjacent chips. This is commonly called "source/load pull effects", and this can happen on both the input and output of the chip. If there is no isolation in this network, chips begin to pull each other down in performance one by one. The isolation in this network provides the system what is commonly called "graceful degradation".

A detailed view of an end-launched transition 64 that couples the split-block waveguide 34 to the input 46 of amplifier chip 44 is illustrated in FIGS. 4a through 4d. Waveguide 34 is made up of a bottom portion 30 machined into heat sink 22 and a top portion 32. Transition 64 is a patterned strip line that may be formed by printing a conductive trace 68 on the surface of a substrate 70 above a conductive ground plane 72. This transition allows us to do an end launch coupling from the waveguide 34 that is parallel in direction to the chip 44. Because the launch is parallel, the limiting factor in spacing is now waveguide dimensions and chip width. A similar configuration of the end-launched transition 66 between the output of the amplifier chip and the input port to the radiator array exists.

At very high frequencies, it is also necessary to use very thin substrate materials with low dielectric constants for the transition. If the substrate 70 is too thick or too high dielectric constant, substrate modes are excited, and performance is poor and hard to predict. Because the material must be very thin (less than 3 mils depending on dielectric constant), there are challenges with assembly. If a thin organic material such as a liquid crystal polymer is used, it will be very fragile, soft, and flexible. At lower frequencies we can use thicker ceramic substrates that can "over hang" the edge into the waveguide. It doesn't need support. Because of the EHF requirements, the transition 64 must be "supported" while "over hanging" into the waveguide.

As can be seen in the figures, there are vias 74 that are covering the parts of the transition not overhanging the waveguide. These lateral extensions 76 of the transition sit on either side of the waveguide 34, and also near the launch point 78 next to the chip. This provides enough structural support for the transition 64 when a very soft thin substrate is used. Because this is coming into the waveguide at the half-height point, there must be a slot 80 machined in for the lateral extensions to sit. This is shown as a cut on the top portion 32. This transition design is very low loss and has a broadband response.

Figure 5A:
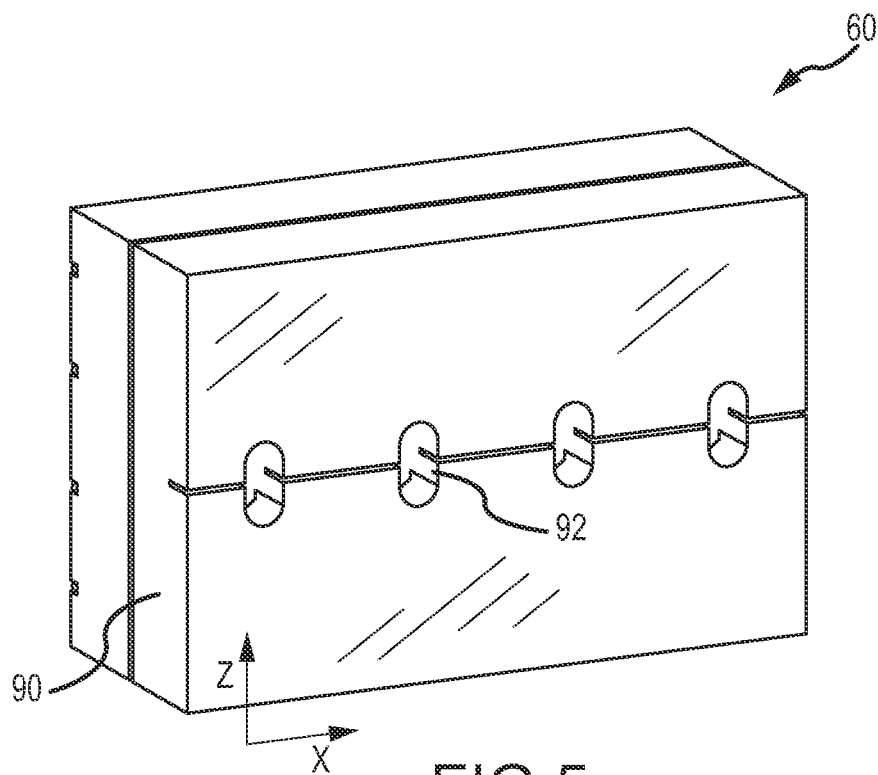
FIGS. 5a through 5c are different views of an output radiator waveguide array that couples amplified power from each amplifier chip into a 2D aperture of free-space radiating elements.
Figure 5B:
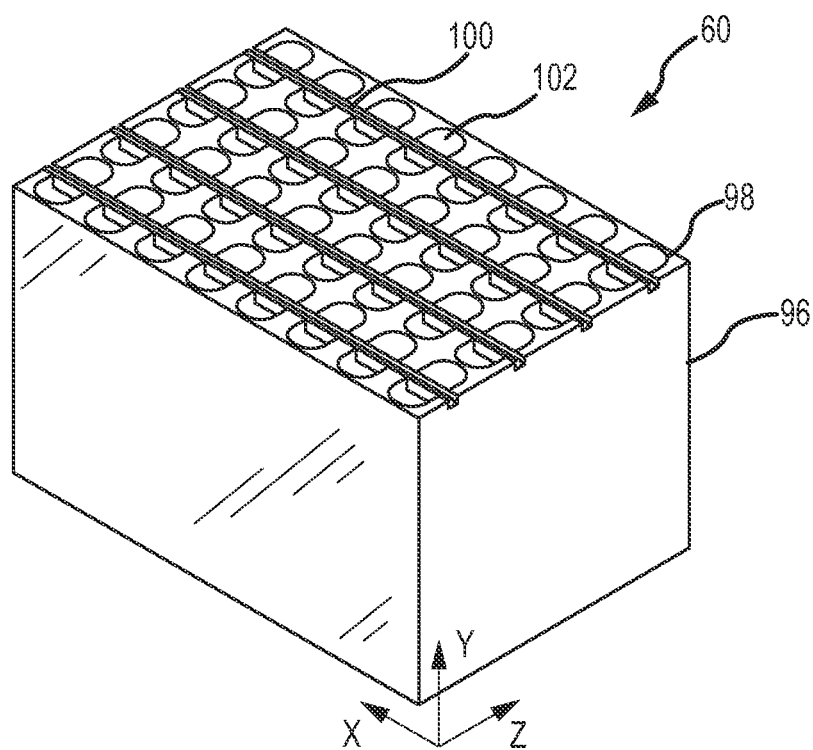
Figure 5C:
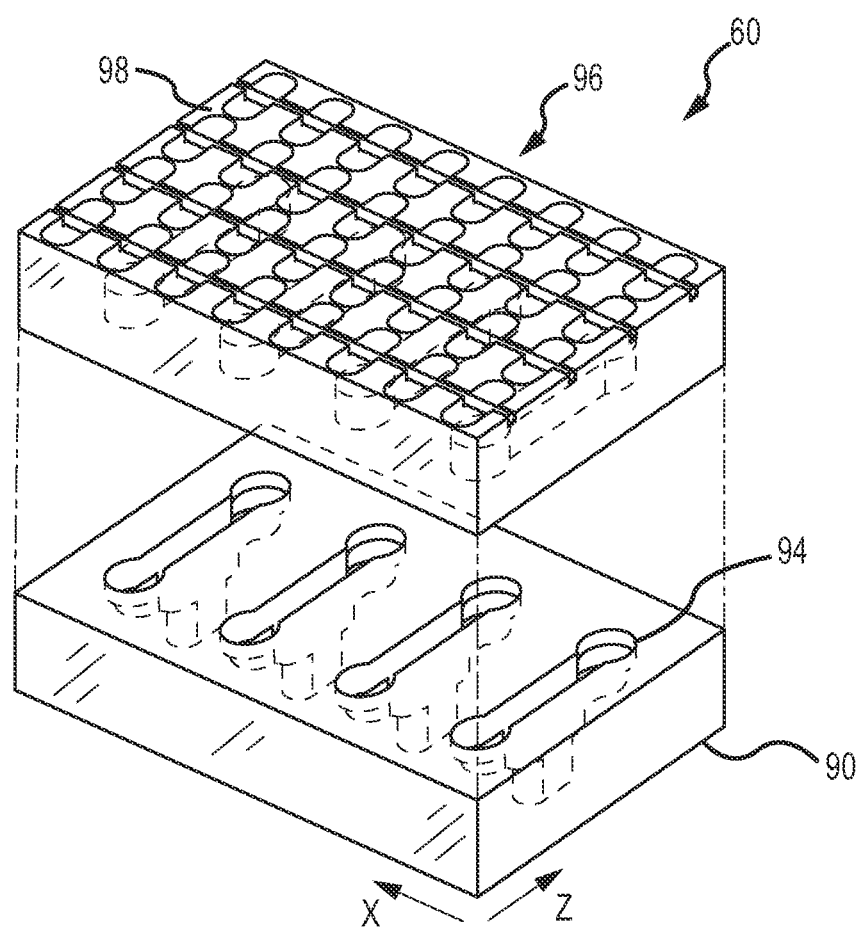

A detailed view of an embodiment of output radiator array 60 is illustrated in FIGS. 5a, 5b and 5c. The output radiator array is an enabler of the modular spatial combining architecture in the higher frequency RF bands. This free-space output splitter needs to be very low loss, broadband, and be able to split one input to multiple output ports maintaining phase and amplitude balance. This output splitter is designed to operate in an infinite array, and this module is fully tileable. This provides great system flexibility in that we can just "grow" the array to meet specific power requirements.

Because the size of the amplifier chip does not scale with frequency (down in size as going up in frequency), there is a limit to how many chips can fit behind a given array aperture. This X limit is set by the chip width. The Z limitation is most often set by cooling requirements. Given these two constraints, it is not possible to have one chip feeding each radiating element (the final small port on the output splitter). Because of these X and Z limitations, the splitter was developed to take the output of 4 chips in a X-Y linear row and spread the energy into a X-Z 2D aperture. This requires splits in both the X and Z directions in order to satisfy the spacing requirements of the radiating elements for spatial combining. For example, each chip is mapped to a 4×4 pattern of radiating elements. The chips together are mapped to a 16×16 pattern of radiating elements that define the 2D aperture.

There are many different ways to configure the output radiator array to map each input to a 4×4 pattern of radiating elements and a 16×16 pattern for the entire module. As shown in this embodiment, output radiator array 60 comprises a first waveguide splitter 90 in the X-Z plane that splits each of the L inputs 92 into two waveguides 94 along the Z-axis, a second waveguide splitter 96 in the X-Z plane that splits each of those waveguides 94 into four waveguides 98 along the X axis, and a third waveguide splitter 100 that splits each of those waveguides 98 into two waveguides 102 along the Z-axis that form the M×N (4×4) free-space radiating elements (the open ends of waveguides 102) in the two-dimensional aperture for each of the L inputs.

In the particular embodiment depicted, the first and second waveguide splitters 90 and 96 are machined parts formed from a block of conductive material such as aluminum or a non-conductive material such as plastic and plated with a conductive material such as gold. The third waveguide splitter 100 is formed by a wire pressed into the second waveguide splitter 96 bisecting the open ends of waveguides 98 to form the two waveguides 102.

Figure 6:
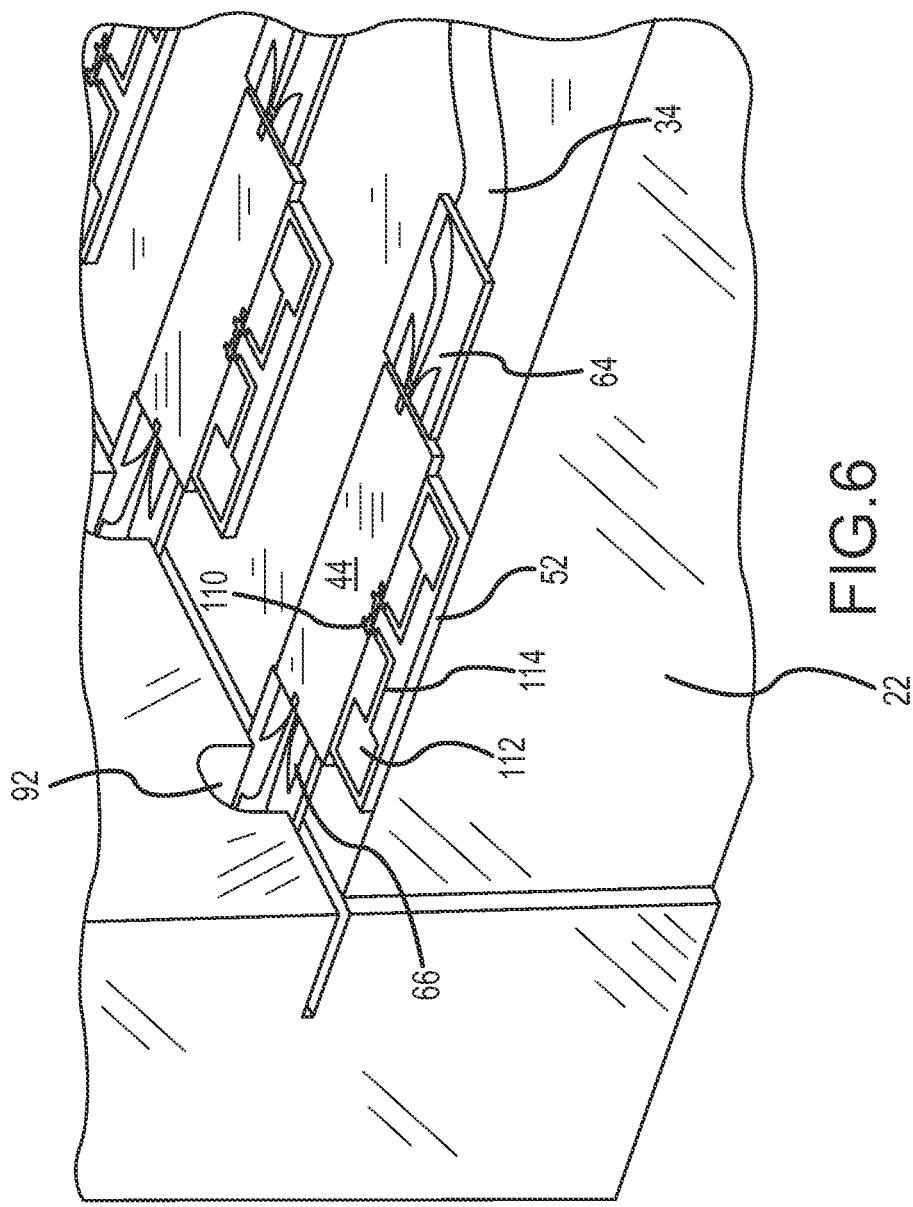
FIGS. 6 and 7 are different views of an interposer circuit for coupling a DC power and control board to the solid-state amplifier chip.
Figure 7:
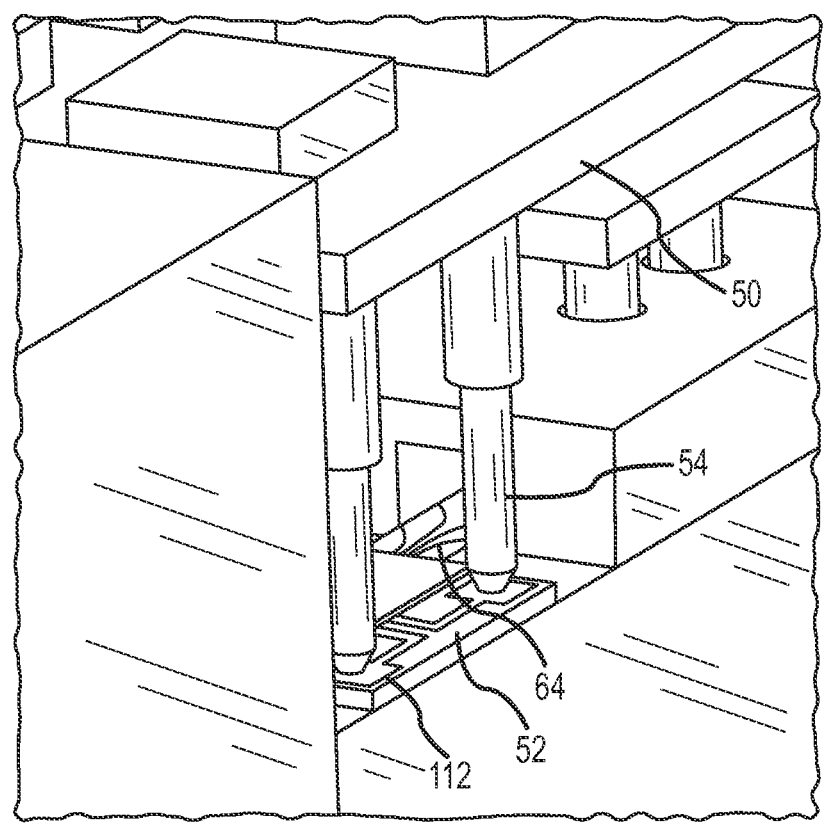

Close up views of the module depicting the interposer circuit boards 52 that provide electrical connections between the DC power and control board 50 and the amplifier chips 44 are shown in FIGS. 6 and 7. Amplifier chips 44 are mounted on the surface of heat sink 22 in a linear row along the X-axis. Each chip is connected between end-launched transitions 64 and 66. End-launched transition 64 overhangs into waveguide 34 of the split-block waveguide splitter and is coupled to the chip input. End-launched transition 66 is coupled to the chip output and overhangs into the input port of the radiator output array.

The interposer circuit board 52 is mounted on the surface of heat sink 22 adjacent amplifier chip 44. Board 52 includes a first set of small bond pads 110 that are electrically connected to a second set of larger bond pads 112 via patterned traces 114. The small bond pads 110 are wire bonded to pads on the amplifier chip. The DC power and control board 50 includes L sets of pins 54 with each set of pins configured to physically contact the second set of larger bond pads 112 on a different one of the interposer circuit boards 52.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A power source module, comprising:
   a heat sink having a surface oriented in an X-Y plane;
   an RF input;
   a 1:L port split-block waveguide splitter having an input waveguide coupled to the RF input and L output waveguides in the X-Y plane, said splitter having a bottom portion formed in the surface of the heat sink and a top portion;
   L solid-state amplifier chips on the surface of the heat sink, each chip having an input and an output;
   a first L chip-to-waveguide end-launched transitions configured to couple the L output waveguides to the inputs of the L solid-state amplifier chips, respectively, each said transition configured to overhang into the corresponding output waveguide for an end launch coupling of the output waveguide to the input of the corresponding chip parallel to that chip in the X-Y plane;
   a second L chip-to-waveguide end-launched transitions configured for an end launch coupling of the outputs of the L solid-state amplifier chips, respectively; and
   an output radiator waveguide array having L radiator input waveguides coupled to the second L chip-to-waveguide end-launched transitions, respectively, in the X-Y plane, each of said second L chip-to-waveguide launched transitions configured to overhang into the corresponding radiator input waveguide for an end launch coupling of the output of the corresponding chip into the radiator input waveguide parallel to that chip, each of said L radiator input waveguides coupled to M×N free-space radiating elements in a two-dimensional aperture in the X-Z plane.

2. The module of claim 1, wherein the split-block waveguide splitter comprises a cascaded connection of at least three 1:2 splitters, each said 1:2 splitter further comprising a waste port for reflections occurring from each of two output ports thereof.

3. The module of claim 1, wherein each of the first L chip-to-waveguide end-launch transitions is formed on a different substrate that extends laterally to either side of the transition, wherein the L output waveguides of the waveguide splitter are formed with slots at a half-height point of the waveguide splitter to receive the lateral extensions and support the overhang of the different substrates into the L output waveguides.

4. The module of claim 3, wherein each of the different substrates is formed of a liquid crystal polymer.

5. The module of claim 1, wherein the output radiator waveguide array comprises:
a first waveguide splitter in the X-Z plane that splits each of the L inputs into a first plurality of waveguides along the Z-axis;
a second waveguide splitter in the X-Z plane that splits each of the first plurality of waveguides into a second plurality of waveguides along the X axis; and
a third waveguide splitter that splits each of the second plurality of waveguides into a third plurality of waveguides along the Z-axis that form the M×N free-space radiating elements in the two-dimensional aperture for each of the L inputs.

6. The module of claim 5, wherein the third waveguide splitter comprises a plurality of wires pressed into the second waveguide splitter to split each of the second plurality of waveguides in two.

7. The module of claim 5, wherein said first plurality is two, said second plurality is four and said third plurality is two.

8. The module of claim 1, wherein $\lambda$ is an operating wavelength of the module, wherein said L solid-state amplifier chips have a chip-to-chip spacing greater than $\lambda$ and said free-space radiating elements have an element-to-element spacing less than $\lambda$.

9. The module of claim 1, further comprising:
L interposer circuit boards, each circuit board including a first set of bond pads for connection to a different one of the L solid-state amplifier chips and a second set of bond pads electrically connected to the first set of bond pads; and
a DC power and control board positioned above the top portion of the 1:L split-block waveguide splitter, said DC power and control board including L sets of pins, each set of pins configured to physically contact the second set of bond pads on a different one of the L interposer circuit boards.

10. The module of claim 9, wherein a spacing of the M×N free-space radiating elements for each of the L solid-state amplifier chips defines a two-dimensional aperture of the module, wherein a thickness of the heat sink is approximately one-half the height of the two-dimensional aperture, wherein the top portion of the waveguide splitter and DC power and control board occupy the other half of the two-dimensional aperture.

11. The module of claim 1, wherein each of the solid-state amplifier chips amplifies RF energy in a spectral band above 75 GHz.

12. The module of claim 11, wherein the module generates a spatially combined output power greater than 1 W.

13. A power source module, comprising:
a heat sink having a surface oriented in an X-Y plane,
an RF input;
a 1:L port split-block waveguide splitter having an input waveguide coupled to the RF input and L output waveguides in the X-Y plane, said splitter having a bottom portion formed in the surface of the heat sink and a top portion on the surface;
L solid-state amplifier chips on the surface of the heat sink, each of said L solid-state amplifier chips having an input and an output and an operating wavelength of $\lambda$ equivalent to an operating frequency greater than 75 GHz, said L solid-state amplifier chips having a chip-to-chip spacing greater than $\lambda$;
L interposer circuit boards on the surface of the heat sink, each said interposer circuit board including a first set of bond pads for connection to a different one of the L solid-state amplifier chips and a second set of bond pads electrically connected to the first set of bond pads;
a DC power and control board positioned above the top portion of the 1:L split-block waveguide splitter within the two-dimensional aperture, each said DC power and control board including L sets of pins, each set of pins configured to physically contact the second set of bond pads on a different one of the L interposer circuit boards;
a first L chip-to-waveguide end-launched transitions configured to couple the L output waveguides to the inputs of the L solid-state amplifier chips, respectively, each said transition configured to overhang into the corresponding output waveguide for an end launch coupling of the output waveguide to the input of the corresponding chip parallel to that chip in the X-Y plane;
a second L chip-to-waveguide end-launched transitions configured for an end launch coupling of the output outputs of the L solid-state amplifier chips, respectively; and
an output radiator waveguide array having L radiator input waveguides coupled to the second L chip-to-waveguide end-launched transitions, respectively, in the X-Y plane, each of said second L chip-to-waveguide launched transitions configured to overhang into the corresponding radiator input waveguide for an end launch coupling of the output of the corresponding chip into the radiator input waveguide parallel to that chip, each of said L radiator input waveguides coupled to M×N free-space radiating elements in the two-dimensional aperture in the X-Z plane with an element-to-element spacing less than $\lambda$ to produce a spatially combined output power greater than 1 W.

14. The module of claim 13, wherein the split-block waveguide splitter comprises a two-stage cascaded connection of at least three 1:2 splitters to provide a 1:4 split, each said 1:2 splitter further comprising a waste port for reflections occurring from each of two output ports thereof, wherein the output radiator waveguide array comprises a three-stage cascaded connection of waveguide splitters to provide each chip with a 4×4 split.

15. The module of claim 13, wherein the output radiator array comprises:
a first waveguide splitter in the X-Z plane that splits each of the L inputs into a first plurality of waveguides along the Z-axis;
a second waveguide splitter in the X-Z plane that splits each of the first plurality of waveguides into a second plurality of waveguides along the X axis; and
a third waveguide splitter that splits each of the second plurality of waveguides into a third plurality of waveguides along the Z-axis that form the M×N free-space radiating elements in the two-dimensional aperture for each of the L inputs.

16. A power source module, comprising:
a heat sink having a surface oriented in an X-Y plane;
an RF input;
a 1:L port split-block waveguide splitter having an input waveguide coupled to the RF input and L output waveguides in the X-Y plane, each of said L output waveguides formed with a slot at a half-height point of the waveguide splitter, said waveguide splitter having a bottom portion formed in the surface of the heat sink and a top portion on the surface;

L solid-state amplifier chips on the surface of the heat sink, each of said L solid-state amplifier chips having an input and an output and an operating wavelength of $\lambda$, said L solid-state amplifier chips having a chip-to-chip spacing greater than $\lambda$;

a first L chip-to-waveguide end-launched transitions configured to couple the L output waveguides to the inputs of the L solid-state amplifier chips, respectively, each said transition formed on a different substrate that extends laterally to either side of the transition into a different one of the slots to overhang into the corresponding output waveguide for an end launch coupling of the output waveguide to the input of the corresponding parallel to that chip in the X-Y plane;

an output radiator waveguide array having L radiator input waveguides each formed with a radiator slot at a half-height point of the waveguide splitter, each of said L radiator input waveguides coupled to M×N free-space radiating elements in a two-dimensional aperture in the X-Z plane with an element-to-element spacing less than $\lambda$; and a second L chip-to-waveguide end-launched transitions configured for an end launch coupling of the outputs of the L solid-state amplifier chips, respectively, said second L chip-to-waveguide end-launched transitions formed on different substrates that extend laterally to either side of each transition into a different one of the radiator slots to overhang into the corresponding radiator input waveguide for an end launched coupling of the outputs of the corresponding chips into the radiator input waveguide parallel to the corresponding chips.

17. The module of claim 16, wherein each of the different substrates is formed of a liquid crystal polymer.

18. The module of claim 16, wherein the operating frequency of each of the L solid-state amplifier chips is greater than 200 GHz.

* * * * *